(12) United States Patent
Amano et al.

(10) Patent No.: US 11,712,982 B2
(45) Date of Patent: Aug. 1, 2023

(54) VEHICLE INCLUDING POWER GENERATION DEVICE

(71) Applicant: TOYOTA JIDOSHA KABUSHIKI KAISHA, Toyota (JP)

(72) Inventors: Takashi Amano, Susono (JP); Takayoshi Kawai, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/700,732

(22) Filed: Mar. 22, 2022

(65) Prior Publication Data

US 2022/0305957 A1 Sep. 29, 2022

(30) Foreign Application Priority Data

Mar. 24, 2021 (JP) .................... 2021-050799

(51) Int. Cl.
*B60L 58/40* (2019.01)
*B60L 50/75* (2019.01)
*H01M 8/04858* (2016.01)
*H01M 16/00* (2006.01)
*H05K 7/20* (2006.01)

(52) U.S. Cl.
CPC ............ *B60L 58/40* (2019.02); *B60L 50/75* (2019.02); *H01M 8/0494* (2013.01); *H01M 16/006* (2013.01); *H05K 7/209* (2013.01); *H05K 7/20854* (2013.01); *H01M 2220/20* (2013.01); *H01M 2250/20* (2013.01)

(58) Field of Classification Search
None
See application file for complete search history.

(56) References Cited

U.S. PATENT DOCUMENTS

| 2011/0093150 A1* | 4/2011 | Yanagisawa | B60K 6/365 180/65.225 |
| 2015/0171495 A1* | 6/2015 | Yadgar | H01M 10/613 429/403 |
| 2017/0259695 A1* | 9/2017 | Ishikawa | B60W 50/0225 |

(Continued)

FOREIGN PATENT DOCUMENTS

| EP | 2275299 A1 | 1/2011 |
| JP | H10-164710 A | 6/1998 |
| JP | H11-146503 A | 5/1999 |

(Continued)

*Primary Examiner* — Jared Fureman
*Assistant Examiner* — Joel Barnett
(74) *Attorney, Agent, or Firm* — Dinsmore & Shohl LLP

(57) ABSTRACT

A vehicle includes: a power storage device; a rotary electric machine; a power generation device; a heat radiation unit configured to radiate exhaust heat from the rotary electric machine and the power generation device; and a control device configured to control power generation by the power generation device so as to increase an amount of power generated by the power generation device when vehicle required power due to drive of the vehicle is smaller than predetermined power compared to when the vehicle required power is larger than the predetermined power. An amount of power generated by the rotary electric machine and the power generation device is equal to or less than allowable generated electric power calculated from the amount of heat that is able to radiated by the heat radiation unit.

16 Claims, 8 Drawing Sheets

(56) References Cited

U.S. PATENT DOCUMENTS

2018/0236883 A1  8/2018  Kokubo et al.

FOREIGN PATENT DOCUMENTS

| JP | 2000-032612 A | 1/2000 |
| JP | 2007-053051 A | 3/2007 |
| JP | 2008-091257 A | 4/2008 |
| JP | 2010-277816 A | 12/2010 |
| JP | 2016-084062 A | 5/2016 |
| JP | 2018-137855 A | 8/2018 |

* cited by examiner

VEHICLE INCLUDING POWER GENERATION DEVICE

CROSS-REFERENCE TO RELATED APPLICATION

This application claims priority to Japanese Patent Application No. 2021-050799 filed on Mar. 24, 2021, incorporated herein by reference in its entirety.

BACKGROUND

1. Technical Field

The present disclosure relates to a vehicle.

2. Description of Related Art

Japanese Unexamined Patent Application Publication No. 11-146503 (JP 11-146503 A) discloses a hybrid electric vehicle that increases the amount of power generated by an electric generator in accordance with an increase in the accelerator operation amount that is an index of a required load.

SUMMARY

However, the heat radiation capability limit of a heat radiation unit that radiates exhaust heat from the electric generator and the like may be reached by increasing the amount of power generated by the electric generator as the required load (accelerator operation amount) becomes larger.

The present disclosure provides a vehicle that can extend the cruising distance by securing the remaining capacity of a power storage device even when the amount of heat radiated from a heat radiation unit is limited.

An aspect of the present disclosure provides a vehicle including: a power storage device; a rotary electric machine configured to receive supply of electric power from the power storage device and generate a drive force for driving the vehicle; a power generation device configured to generate electric power to be supplied to the power storage device; a heat radiation unit configured to radiate exhaust heat from the rotary electric machine and the power generation device; and a control device. An amount of power generated by the rotary electric machine and the power generation device is equal to or less than allowable generated electric power calculated from an amount of heat that is able to be radiated by the heat radiation unit. The control device is configured to control power generation by the power generation device so as to increase an amount of power generated by the power generation device when vehicle required power due to drive of the vehicle is smaller than predetermined power compared to when the vehicle required power is larger than the predetermined power.

With the vehicle according to the aspect of the present disclosure, it is possible to extend the cruising distance by securing the remaining capacity of the power storage device even when the amount of heat radiated from the heat radiation unit is limited.

In the vehicle according to the aspect of the present disclosure, the control device may be configured to control power generation by the power generation device such that the amount of power generated by the power generation device is larger as the vehicle required power is smaller.

With the vehicle according to the aspect of the present disclosure, it is possible to reliably secure the remaining capacity of the power storage device by causing the power generation device to generate power with a large power generation amount while the vehicle required power is small.

In the vehicle according to the aspect of the present disclosure, the heat radiation unit may be configured to also radiate exhaust heat from an accessory provided in the vehicle; and the vehicle required power may include accessory consumed electric power consumed to drive the accessory.

With the vehicle according to the aspect of the present disclosure, it is possible to cause the power generation device to generate power in consideration of exhaust heat from the accessory that matches the accessory consumed electric power as well.

In the vehicle according to the aspect of the present disclosure, the control device may be configured to control power generation by the power generation device by predicting electric power that is required for the vehicle to reach a destination.

With the vehicle according to the aspect of the present disclosure, excessive power generation by the power generation device can be suppressed, and a useless increase in exhaust heat from the power generation device to be radiated from the heat radiation unit can be suppressed.

In the vehicle according to the aspect of the present disclosure, the control device may be configured to perform power generation by the power generation device by controlling drive of the rotary electric machine when a remaining capacity of the power storage device is smaller than a predetermined capacity.

With the vehicle according to the aspect of the present disclosure, the remaining capacity of the power storage device can be secured.

In the vehicle according to the aspect of the present disclosure, the vehicle may be configured to be able to travel in a high-vacuum environment.

With the vehicle according to the aspect of the present disclosure, it is possible to extend the cruising distance by securing the remaining capacity of the power storage device even when the amount of heat radiated from the heat radiation unit is limited in a high-vacuum environment such as at a high altitude or in a space environment.

The vehicle according to the present disclosure achieves the effect of extending the cruising distance by securing the remaining capacity of a power storage device even when the amount of heat radiated from a heat radiation unit is limited.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

First Embodiment

A vehicle according to a first embodiment of the present disclosure will be described below. The present embodiment does not limit applicable embodiments.

Figure 1:
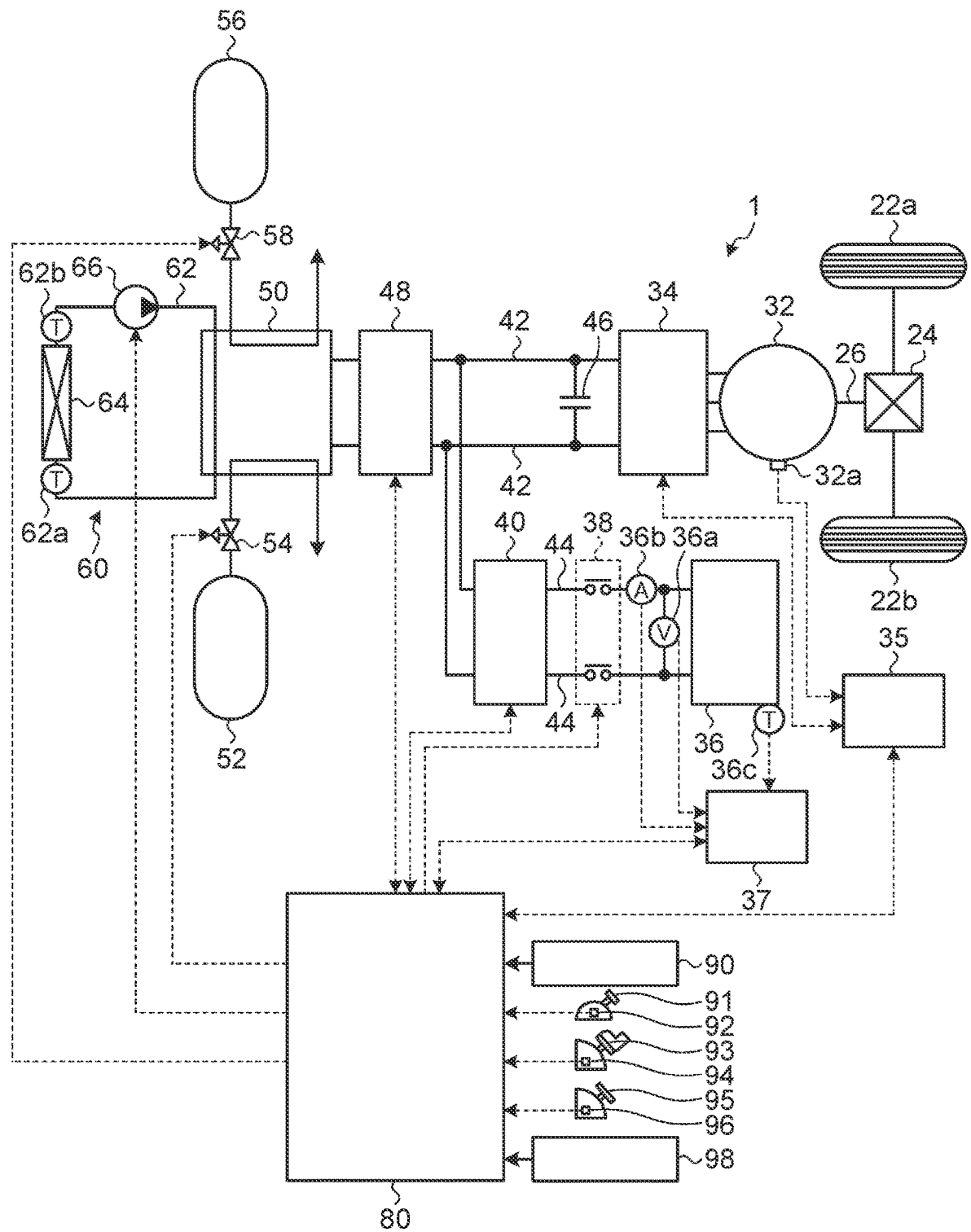
FIG. 1 is a diagram illustrating an overview of the configuration of a vehicle according to a first embodiment.

FIG. 1 is a diagram illustrating an overview of the configuration of a vehicle 1 according to a first embodiment. The vehicle 1 according to the first embodiment is a hybrid electric vehicle (HEV), such as a series hybrid electric vehicle (HEV) or a plug-in hybrid electric vehicle (PHEV), configured to be able to travel in a high-vacuum environment such as at a high altitude or in a space environment, for example. The vehicle 1 according to the first embodiment includes a motor 32 as a rotary electric machine, an inverter 34, a motor electronic control unit (ECU) 35 as a motor electronic control device, a battery 36 as a power storage device, a battery ECU 37 as a battery electronic control device, a system main relay 38, a battery voltage boosting converter 40, a fuel cell (FC) voltage boosting converter 48, a fuel cell 50, a cooling device 60, and a main ECU 80 as a main electronic control device.

The motor 32 is constituted as a synchronous motor generator, and includes a rotor in which a permanent magnet is embedded and a stator around which a three-phase coil is wound. The rotor of the motor 32 is connected to a drive shaft 26 coupled to drive wheels 22a, 22b via a differential gear 24. The inverter 34 is connected to the motor 32, and connected to high-voltage power lines 42. The motor 32 is rotationally driven as a transistor of the inverter 34 is subjected to switching control performed by the motor ECU 35. The motor 32 is a drive source that drives the drive wheels 22 of the vehicle 1, and is operable in a power running mode, in which the motor 32 executes power running for driving the vehicle 1, and a regeneration mode, in which the motor 32 operates as an electric generator to generate regenerated electric power and generate a braking force for the vehicle during braking.

The motor ECU 35 is constituted as a microprocessor that includes a central processing unit (CPU) as a central component, and includes a read only memory (ROM) that stores a processing program, a random access memory (RAM) that temporarily stores data, input and output ports, and a communication port, besides the CPU. A rotational position from a rotational position detection sensor 32a that detects the rotational position of the rotor of the motor 32, for example, is input to the motor ECU 35 via the input port. A switching control signal for the transistor of the inverter 34 and the like is output from the motor ECU 35 via the output port. The motor ECU 35 computes the rotational speed of the motor 32 based on the rotational position of the rotor of the motor 32 from the rotational position detection sensor 32a.

The battery 36 is constituted as a lithium-ion battery or a nickel-metal hydride battery, for example, and connected to low-voltage power lines 44. The battery 36 is managed by the battery ECU 37. The battery 36 can store electric power generated by the fuel cell 50 and regenerated electric power generated by the motor 32 during braking of the vehicle 1, and functions as a power source that supplies electric power to loads including the motor 32 and various accessories such as an air conditioning device and an electrical device.

The battery ECU 37 is constituted as a microprocessor that includes a CPU as a central component, and includes a ROM that stores a processing program, a RAM that temporarily stores data, input and output ports, and a communication port, besides the CPU. A voltage from a voltage sensor 36a attached between the terminals of the battery 36, a current from a current sensor 36b attached to the output terminal of the battery 36, a battery temperature from a temperature sensor 36c attached to the battery 36, and the like are input to the battery ECU 37 via the input port. The battery ECU 37 computes a stored power proportion SOC based on an integrated value of the current from the current sensor 36b. The stored power proportion SOC is the proportion of the volume of electric power that can be discharged from the battery 36 to the total capacity of the battery 36. The battery ECU 37 also computes a battery input limit and a battery output limit W, which correspond to maximum allowable electric power that may be applied to and discharged from the battery 36, based on the stored power proportion SOC and the battery temperature from the temperature sensor 36c. Further, the battery ECU 37 sets required charge/discharge power (discharge side: positive) required by the battery 36 based on the stored power proportion SOC.

The battery voltage boosting converter 40 is connected to the high-voltage power lines 42 and the low-voltage power lines 44. A smoothing capacitor 46 is connected to a positive electrode bus line and a negative electrode bus line of the high-voltage power lines 42. A system main relay 38 is attached to the low-voltage power lines 44. The FC voltage boosting converter 48 is connected to the output terminals of the fuel cell 50 and the high-voltage power lines 42.

The fuel cell 50 is constituted as a polymer electrolyte fuel cell stack in which a plurality of unit cells are stacked with separators serving as partition walls between the cells, the unit cells being each composed of an electrolyte membrane and an anode electrode and a cathode electrode sandwiching the electrolyte membrane. The fuel cell 50 generates power through an electrochemical reaction between hydrogen supplied to the anode electrode from a hydrogen tank 52 via a hydrogen valve 54 and oxygen supplied to the cathode electrode from an oxygen tank 56 via an oxygen valve 58. In the present embodiment, power generation by the fuel cell 50 is also referred to as FC power generation. Alternatively, oxygen in air may be supplied to the cathode electrode of the fuel cell 50 using a blower. In the vehicle 1 according to the first embodiment, a power generation device is constituted by the fuel cell 50, the hydrogen tank 52, the hydrogen valve 54, the oxygen tank 56, the oxygen valve 58, and the like.

Figure 2:
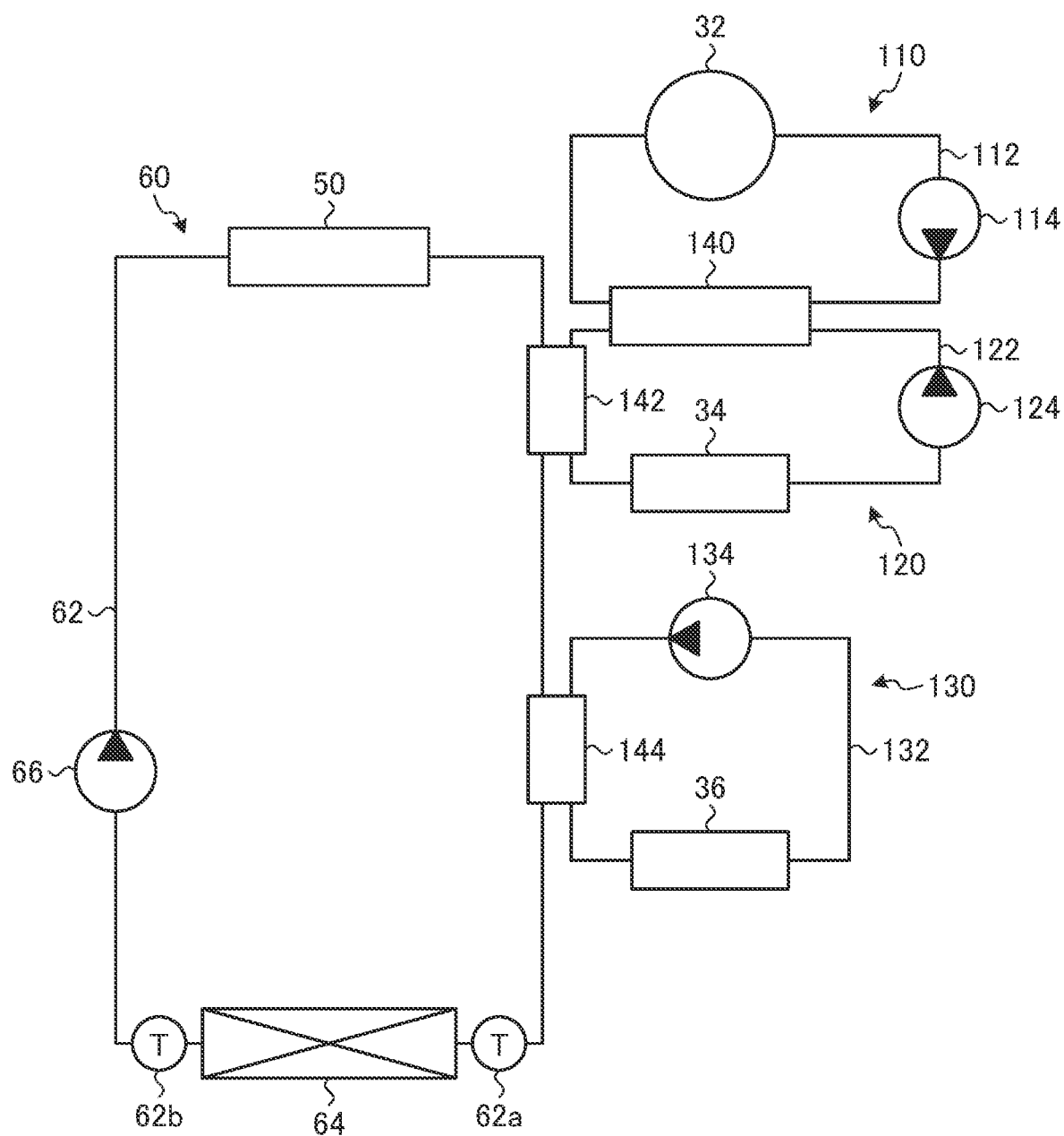
FIG. 2 illustrates an example of the configuration of cooling circuits provided in the vehicle according to the first embodiment.

FIG. 2 illustrates an example of the configuration of cooling circuits provided in the vehicle 1 according to the first embodiment. The fuel cell 50 is cooled through heat exchange with a coolant by the cooling device 60. The cooling device 60 is constituted from a cooling circuit that includes a circulation flow path 62 that connects between a radiator 64 and the fuel cell 50 and a circulation pump 66 that circulates a coolant in the circulation flow path 62. In the vehicle 1 according to the first embodiment, as illustrated in FIG. 2, exhaust heat from components that constitute a power train, such as the motor 32, the inverter 34, and the battery 36, is transferred from cooling circuits 110, 120, 130 provided in correspondence with such components to a coolant that flows through the circulation flow path 62 of the cooling device 60 to be radiated from the radiator 64. The radiator 64 is an example of the heat radiation unit according to the present disclosure.

The cooling circuit 110 provided in correspondence with the motor 32 includes a circulation flow path 112 that connects between the motor 32 and a heat exchanger 140 and a circulation pump 114 that circulates a coolant in the circulation flow path 112. The cooling circuit 120 provided in correspondence with the inverter 34 includes a circulation flow path 122 that connects the inverter 34, the heat exchanger 140, and a heat exchanger 142 and a circulation pump 124 that circulates a coolant in the circulation flow path 122. The cooling circuit 130 provided in correspondence with the battery 36 includes a circulation flow path 132 that connects between the battery 36 and a heat exchanger 144 and a circulation pump 134 that circulates a coolant in the circulation flow path 132. Exhaust heat from the motor 32 is transferred from the coolant that flows through the circulation flow path 112 of the cooling circuit 110 to the coolant that flows through the circulation flow path 122 of the cooling circuit 120 via the heat exchanger 140. In the cooling circuit 120, exhaust heat from the inverter 34 is transferred from the coolant that flows through the circulation flow path 122 to the coolant that flows through the circulation flow path 62 of the cooling device 60 via the heat exchanger 142 together with the exhaust heat from the motor 32 which has been transferred to the coolant that flows through the circulation flow path 122. Meanwhile, exhaust heat from the battery 36 is transferred from the coolant that flows through the circulation flow path 132 of the cooling circuit 130 to the coolant that flows through the circulation flow path 62 of the cooling device 60 via the heat exchanger 144. In this manner, exhaust heat from each of the motor 32, the inverter 34, and the battery 36 is transferred from the cooling circuits 110, 120, 130 to the coolant that flows through the circulation flow path 62 of the cooling device 60 to be radiated from the radiator 64.

The main ECU 80 is constituted as a microprocessor that includes a CPU as a central component, and includes a ROM that stores a processing program, a RAM that temporarily stores data, input and output ports, and a communication port, besides the CPU.

Signals from various sensors are input to the main ECU 80 via the input port. Examples of the signals input to the main ECU 80 include a coolant temperature at a radiator entrance from a temperature sensor 62*a* attached around the radiator entrance through which the coolant flows into the radiator 64, and a coolant temperature at a radiator exit from a temperature sensor 62*b* attached around the radiator exit through which the coolant flows out of the radiator 64. Information that is necessary for travel control is also input to the main ECU 80, since the main ECU 80 also functions as a drive control device for the vehicle. Examples of such information include an ignition signal from an ignition switch 90, a shift position from a shift position sensor 92 that detects the operation position of a shift lever 91, an accelerator operation amount from an accelerator pedal position sensor 94 that detects the amount of depression of an accelerator pedal 93, a brake pedal position from a brake pedal position sensor 96 that detects the amount of depression of a brake pedal 95, and a vehicle speed from a vehicle speed sensor 98.

Various control signals are output from the main ECU 80 via the output port. Examples of the signals output from the main ECU 80 include a drive control signal for the system main relay 38, a switching control signal for a transistor of the battery voltage boosting converter 40, and a switching control signal for a transistor of the FC voltage boosting converter 48. Other examples include a drive signal for a pump motor that drives the circulation pump 66, a drive signal for a hydrogen valve drive motor that drives the hydrogen valve 54, and a drive signal for an oxygen valve drive motor that drives the oxygen valve 58.

The main ECU 80 is connected so as to be able to communicate with the motor ECU 35 and the battery ECU 37, and exchanges various information and signals with the motor ECU 35 and the battery ECU 37. When the ignition switch 90 is turned on, the main ECU 80 turns on the system main relay 38, and activates the fuel cell 50 to establish a state (ready-on state) in which the vehicle can travel. When the ready-on state is established with the fuel cell 50 activated, the main ECU 80 controls operation of the fuel cell 50 and controls drive of the motor 32 such that required torque that matches the accelerator operation amount is output to the drive shaft 26 using electric power generated by the fuel cell 50 and electric power charged to and discharged from the battery 36. When the fuel cell 50 is activated, in addition, the main ECU 80 controls the cooling device 60 such that the temperature of the fuel cell 50 is kept at an appropriate temperature.

In the vehicle 1 according to the first embodiment, the amount of power generated by the motor 32 and the power generation device is equal to or less than allowable generated electric power calculated from the amount of heat that can be radiated from the radiator 64. In the vehicle 1 according to the first embodiment, power generation by the power generation device is controlled such that the FC power generation amount is large when vehicle required power due to drive of the vehicle 1 is smaller than predetermined power compared to when the vehicle required power is larger than the predetermined power.

Figure 3:
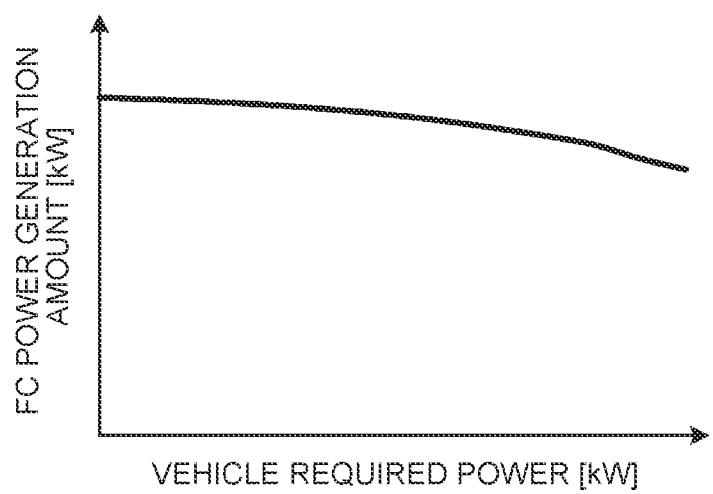
FIG. 3 illustrates an example of a fuel cell (FC) power generation map that is used by a main electronic control unit (ECU) according to the first embodiment to control FC power generation.
Figure 4:
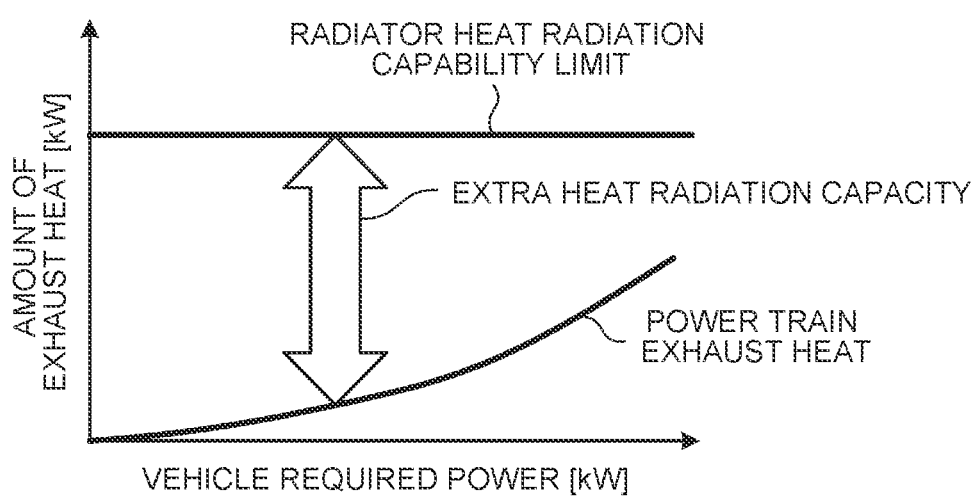
FIG. 4 illustrates an example of the relationship between vehicle required power and the amount of exhaust heat for the vehicle according to the first embodiment.

FIG. 3 illustrates an example of an FC power generation map that is used by the main ECU 80 according to the first embodiment to control FC power generation. FIG. 4 illustrates an example of the relationship between vehicle required power and the amount of exhaust heat for the vehicle 1 according to the first embodiment.

The vehicle 1 according to the first embodiment has an FC power generation map as illustrated in FIG. 3. In the FC power generation map, the FC power generation amount is generally inversely proportional to the vehicle required power, specifically the FC power generation amount becomes smaller as the vehicle required power becomes larger. In the present embodiment, the vehicle required power is the total of travel required power required for the vehicle 1 to travel and vehicle consumed electric power consumed by accessories.

As illustrated in FIG. 4, power train exhaust heat becomes larger as the vehicle required power becomes larger, and the extra heat radiation capacity of the radiator 64 that is obtained by subtracting the power train exhaust heat from the radiator heat radiation capability limit becomes smaller as the vehicle required power becomes larger. The extra heat radiation capacity of the radiator 64 represents the range of the amount of heat generated through FC power generation that can be added to the power train exhaust heat for predetermined vehicle required power, for example.

Therefore, in the vehicle 1 according to the first embodiment, the main ECU 80 controls FC power generation using the FC power generation map illustrated in FIG. 3 such that the FC power generation amount becomes smaller as the vehicle required power becomes larger, for example, so that the amount of exhaust heat generated through FC power generation falls within the range of the extra heat radiation capacity of the radiator 64. Consequently, with the vehicle 1 according to the first embodiment, it is possible to extend the cruising distance of the vehicle 1 by securing the remaining capacity of the battery 36 by performing FC power generation even when the amount of exhaust heat generated through FC power generation is limited such that the radiator heat radiation capability limit is not exceeded.

In the vehicle 1 according to the first embodiment, by performing FC power generation such that the FC power generation amount is larger as the vehicle required power is smaller, it is possible to reliably secure the remaining capacity of the battery 36, compared to when FC power generation is performed with an FC power generation amount at the time when the vehicle required power is large also when the vehicle required power is small, for example.

Second Embodiment

Next, a vehicle 1 according to a second embodiment will be described. In the description of the second embodiment, like reference signs are used for components that are similar to those according to the first embodiment to omit description as appropriate. In the vehicle 1 according to the second embodiment, the FC power generation amount is equal to or less than allowable generated electric power calculated from the amount of heat that can be radiated (exhausted) from the radiator 64. In the vehicle 1 according to the second embodiment, the FC power generation amount is made smaller as the absolute value of the vehicle required power becomes larger compared to a predetermined value during power running and regeneration of the motor 32.

Figure 5:
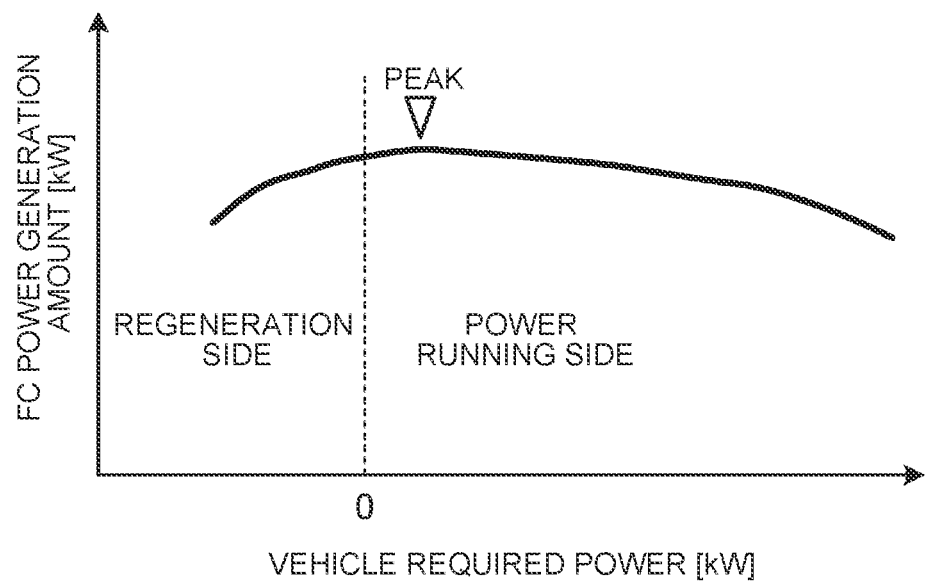
FIG. 5 illustrates an example of an FC power generation map that is used by a main ECU according to a second embodiment to control FC power generation.
Figure 6:
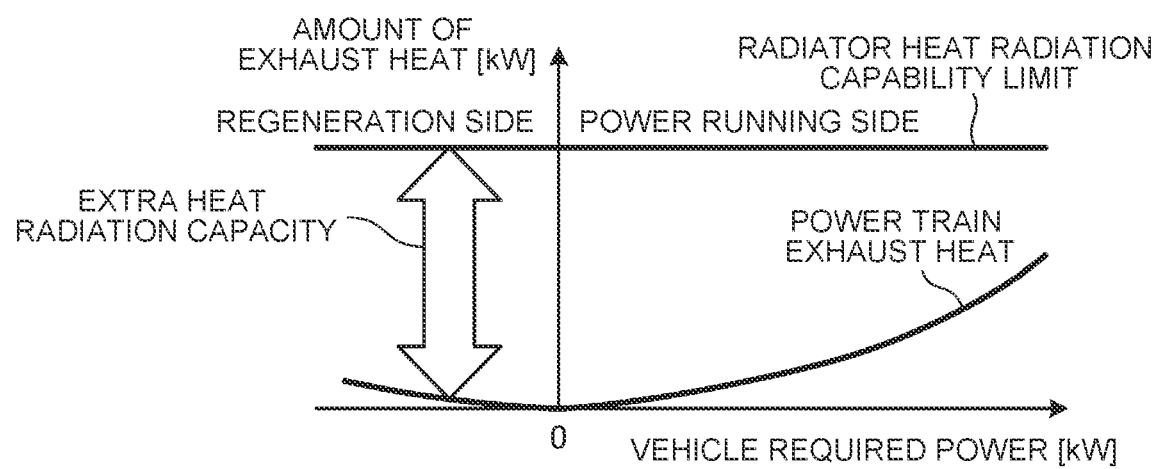
FIG. 6 illustrates an example of the relationship between vehicle required power and the amount of exhaust heat for a vehicle according to the second embodiment.

FIG. 5 illustrates an example of an FC power generation map that is used by the main ECU 80 according to the second embodiment to control FC power generation. FIG. 6 illustrates an example of the relationship between vehicle required power and the amount of exhaust heat for the vehicle 1 according to the second embodiment.

The vehicle 1 according to the second embodiment has an FC power generation map in which the FC power generation amount is generally inversely proportional to the vehicle required power on each of the power running side and the regeneration side of the motor 32 as illustrated in FIG. 5. In the FC power generation map illustrated in FIG. 5, the peak of the FC power generation amount is positioned on the positive side of the vehicle required power (vehicle required power corresponds to vehicle consumed electric power when the travel required power is zero), for example, with respect to the point at which the vehicle required power is zero. However, the FC power generation amount may peak when the vehicle required power is zero.

In the FC power generation map on the power running side illustrated in FIG. 5, the FC power generation amount is set so as to become smaller as the vehicle required power becomes larger on the positive side. In the FC power generation map on the regeneration side illustrated in FIG. 5, meanwhile, the FC power generation amount is set so as to become smaller as the vehicle required power becomes larger on the negative side, in other words, as the amount of power generated through regeneration of the motor 32 becomes larger. The FC power generation map on the power running side and the FC power generation map on the regeneration side are not limited to being symmetric, since the FC power generation maps are varied in accordance with the components (such as the motor 32 and the battery 36), system design, and the like.

As illustrated in FIG. 6, the power train exhaust heat becomes larger as the vehicle required power becomes larger on the positive side and the power train exhaust heat becomes larger as the vehicle required power becomes larger on the negative side, with reference to the point at which the vehicle required power is zero. Therefore, the extra heat radiation capacity of the radiator 64 that is obtained by subtracting the power train exhaust heat from the radiator heat radiation capability limit becomes smaller as the vehicle required power becomes larger on the positive side, and becomes smaller as the vehicle required power becomes larger on the negative side, with reference to the point at which the vehicle required power is zero.

In the vehicle 1 according to the second embodiment, the main ECU 80 controls FC power generation using the FC power generation map illustrated in FIG. 5, for example, so that the amount of exhaust heat generated through FC power generation falls within the range of the extra heat radiation capacity of the radiator 64. That is, during power running of the motor 32, the main ECU 80 controls FC power generation such that the FC power generation amount becomes smaller as the vehicle required power becomes larger on the positive side with respect to a predetermined value at which the FC power generation amount peaks on the FC power generation map on the power running side. During regeneration of the motor 32, meanwhile, the main ECU 80 controls FC power generation such that the FC power generation amount becomes smaller as the vehicle required power becomes larger on the negative side on the FC power generation map on the regeneration side. Consequently, with the vehicle 1 according to the second embodiment, it is possible to extend the cruising distance of the vehicle 1 by securing the remaining capacity of the battery 36 by performing FC power generation even when the amount of exhaust heat generated through FC power generation is limited such that the radiator heat radiation capability limit is not exceeded during power running and regeneration of the motor 32.

Third Embodiment

Next, a vehicle 1 according to a third embodiment will be described. In the description of the third embodiment, like reference signs are used for components that are similar to those according to the first embodiment to omit description as appropriate.

In the vehicle 1 according to the third embodiment, the amount of power generated by the motor 32 and the power generation device is equal to or less than allowable generated electric power calculated from the amount of heat that can be radiated from the radiator 64. In the vehicle 1 according to the third embodiment, the FC power generation amount is made smaller as the absolute value of the vehicle required power becomes larger compared to a predetermined value.

Figure 7:
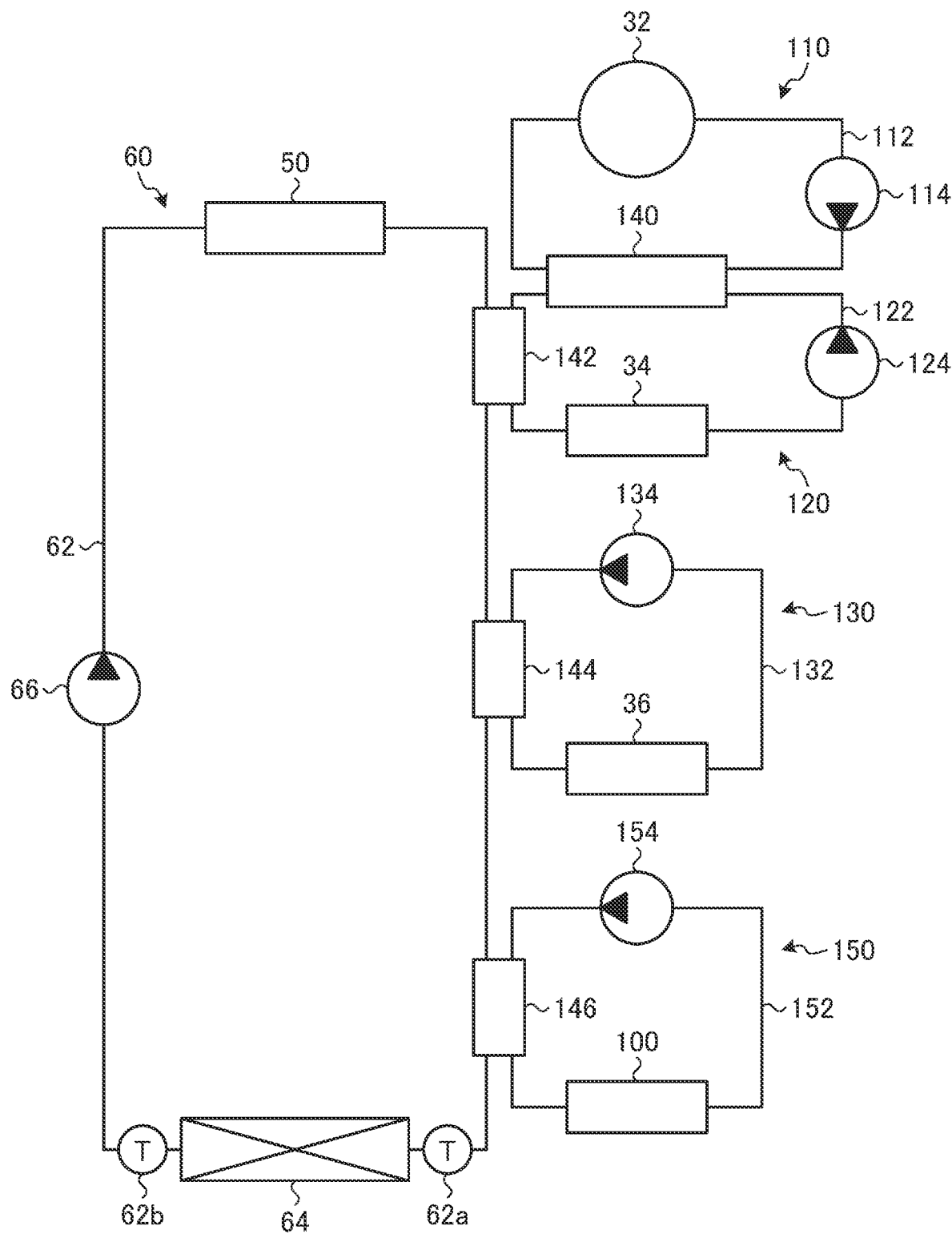
FIG. 7 illustrates an example of the configuration of cooling circuits provided in a vehicle according to a third embodiment.

FIG. 7 illustrates an example of the configuration of cooling circuits provided in the vehicle 1 according to the third embodiment. In the vehicle 1 according to the third embodiment, the radiator 64 is configured to radiate not only power train exhaust heat but also exhaust heat from components other than the power train such as accessories (hereinafter referred to as "other exhaust heat"). In the vehicle 1 according to the third embodiment, as illustrated in FIG. 7, for example, exhaust heat from an accessory 100 is radiated from the radiator 64 by transferring such heat from a cooling circuit 150 provided in correspondence with the accessory 100 to a coolant that flows through the circulation flow path 62 of the cooling device 60. The cooling circuit 150 provided in correspondence with the accessory 100 includes a circulation flow path 152 that connects between the accessory 100 and a heat exchanger 146 and a circulation pump 154 that circulates a coolant in the circulation flow path 152. Exhaust heat from the accessory 100 is transferred from the coolant that flows through the circulation flow path 152 of the cooling circuit 150 to a coolant that flows through the circulation flow path 122 of the cooling circuit 120 via the heat exchanger 146. In the vehicle 1 according to the third embodiment, in this manner, exhaust heat from each of the motor 32, the inverter 34, the battery 36, and the accessory 100 is transferred from the cooling circuits 110, 120, 130, 150 to the coolant that flows through the circulation flow path 62 of the cooling device 60 to be radiated from the radiator 64. Examples of the other exhaust heat include exhaust heat from a life support device and a drive assist device for a passenger in a high-vacuum environment such as at a high altitude or in a space environment, and the other exhaust heat is transferred from a cooling circuit provided in correspondence with such devices to a coolant that flows through the circulation flow path 62 of the cooling device 60 to be radiated from the radiator 64.

Figure 8:
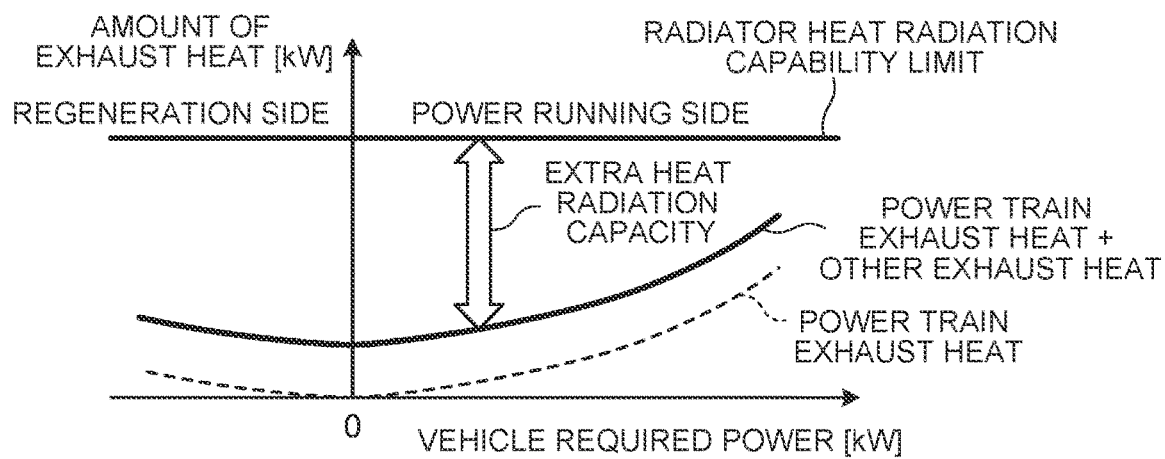
FIG. 8 illustrates an example of the relationship between vehicle required power and the amount of exhaust heat for the vehicle according to the third embodiment.
Figure 9:
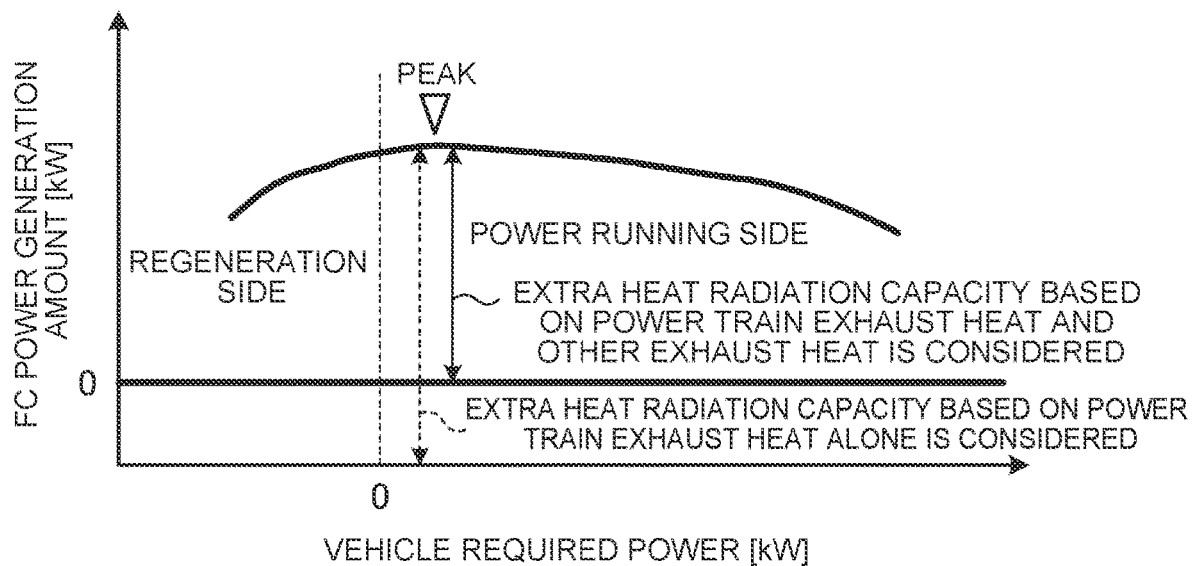
FIG. 9 illustrates an example of an FC power generation map that is used by a main ECU according to the third embodiment to control FC power generation.

FIG. 8 illustrates an example of the relationship between vehicle required power and the amount of exhaust heat for the vehicle 1 according to the third embodiment. FIG. 9 illustrates an example of an FC power generation map that is used by the main ECU 80 according to the third embodiment to control FC power generation.

In the vehicle 1 according to the third embodiment, as illustrated in FIG. 8, FC power generation is controlled so that the amount of exhaust heat generated through FC power generation falls within the range of the extra heat radiation capacity of the radiator 64 that is obtained by subtracting the total of the power train exhaust heat and exhaust heat from components other than the power train (power train exhaust heat+exhaust heat from components other than the power train), from the radiator heat radiation capability limit.

In the vehicle 1 according to the third embodiment, as illustrated in FIG. 8, the extra heat radiation capacity of the radiator 64 obtained by subtracting the total of the power train exhaust heat and the other exhaust heat (power train exhaust heat+other exhaust heat) from the radiator heat radiation capability limit is smaller than the extra heat radiation capacity of the radiator 64 obtained by subtracting the power train exhaust heat from the radiator heat radiation capability limit for the same vehicle required power. Therefore, the vehicle 1 according to the third embodiment uses an FC power generation map, such as that illustrated in FIG. 9, for example, in which the position at which the FC power generation amount is zero is set such that the FC power generation amount is small in consideration of the extra heat radiation capacity of the radiator 64 obtained based on the total of the power train exhaust heat and the other exhaust heat, compared to the FC power generation map illustrated in FIG. 5 according to the second embodiment in which the extra heat radiation capacity of the radiator 64 obtained based on the power train exhaust heat alone is taken into consideration.

In the vehicle 1 according to the third embodiment, the main ECU 80 controls FC power generation using the FC power generation map illustrated in FIG. 9, for example, so that the amount of exhaust heat generated through FC power generation falls within the range of the extra heat radiation capacity of the radiator 64. That is, during power running of the motor 32, the main ECU 80 controls FC power generation such that the FC power generation amount becomes smaller as the vehicle required power becomes larger on the positive side with respect to a predetermined value at which the FC power generation amount peaks on the FC power generation map on the power running side. During regeneration of the motor 32, meanwhile, the main ECU 80 controls FC power generation such that the FC power generation amount becomes smaller as the vehicle required power becomes larger on the negative side on the FC power generation map on the regeneration side. Consequently, with the vehicle 1 according to the third embodiment, it is possible to extend the cruising distance of the vehicle 1 by securing the remaining capacity of the battery 36 by performing FC power generation even when the amount of exhaust heat generated through FC power generation is limited such that the radiator heat radiation capability limit is not exceeded, when exhaust heat to be radiated by the radiator 64 is the total of the power train exhaust heat and the other exhaust heat during power running and regeneration of the motor 32.

Figure 10:
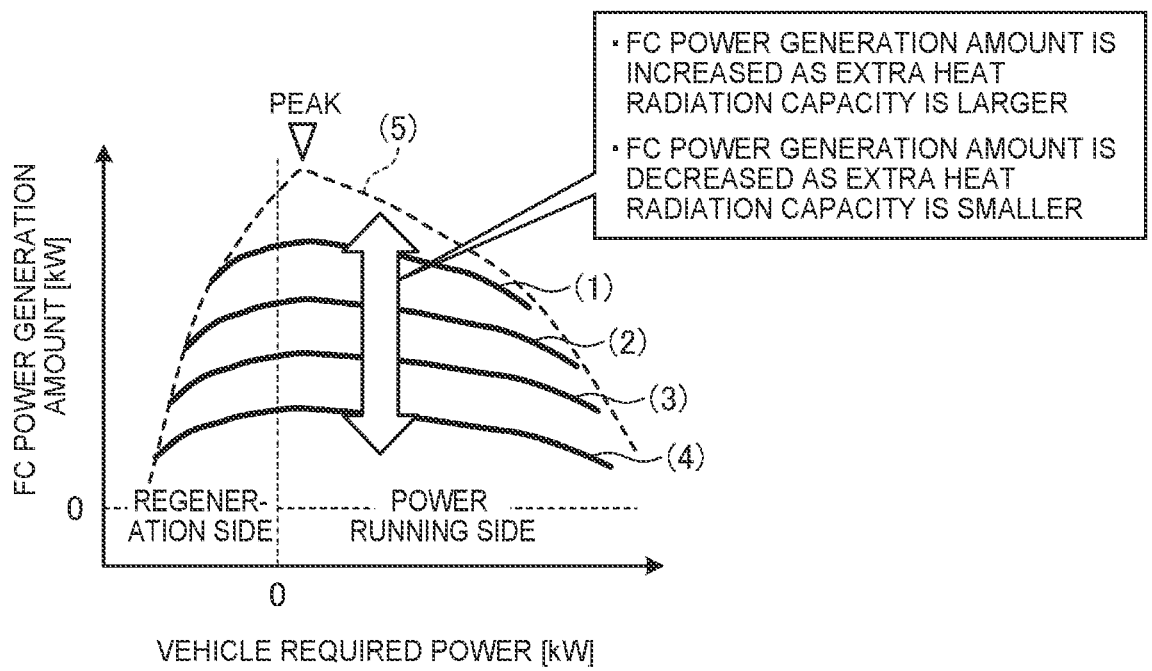
FIG. 10 illustrates an example of a plurality of FC power generation maps that is used by the main ECU according to the third embodiment to control FC power generation.

FIG. 10 illustrates an example of a plurality of FC power generation maps that is used by the main ECU 80 according to the third embodiment to control FC power generation. In FIG. 10, curves (1) to (4) represent a plurality of FC power generation maps that matches the magnitudes of the extra heat radiation capacity of the radiator 64, and a curve (5) represents an FC power generation map corresponding to the radiator heat radiation capability limit. The extra heat radiation capacity of the radiator 64 becomes smaller, and therefore the FC power generation amount becomes smaller, in the order of the FC power generation map (1), the FC power generation map (2), the FC power generation map (3), and the FC power generation map (4). The FC power generation maps (1) to (4) are prepared in advance through experiments and the like, for example.

In the vehicle 1 according to the third embodiment, the heat radiation performance of the radiator 64 is varied constantly in accordance with variations in the external environment such as the relative direction of the radiator 64 and sunlight irradiation, variations in accessory consumed electric power, the status of processing of exhaust heat from the power train, and the like, for example. Therefore, in the vehicle 1 according to the third embodiment, the FC power generation map that is used to control FC power generation is corrected each time in accordance with variations in the heat radiation performance of the radiator 64.

For example, a plurality of FC power generation maps (1) to (4) that matches the magnitudes of the extra heat radiation capacity of the radiator 64 is prepared as illustrated in FIG. 10. The main ECU 80 uses an FC power generation map in which the FC power generation amount is increased as the extra heat radiation capacity of the radiator 64 is larger and an FC power generation map in which the FC power generation amount is decreased as the extra heat radiation capacity of the radiator 64 is smaller. The main ECU 80 selects the FC power generation map (1), among the FC power generation maps (1) to (4), when the extra heat radiation capacity of the radiator 64 is largest, and selects the FC power generation map (4) when the extra heat radiation capacity of the radiator 64 is smallest. Correction of the FC power generation map is not limited to use of a plurality of FC power generation maps, and the FC power generation map may be corrected by the main ECU 80 continuously varying the FC power generation map based on reference data for correction, for example.

In the vehicle 1 according to the third embodiment, the FC power generation map may be corrected by navigation guidance (pre-reading of a travel route of the vehicle 1). For example, excessive FC power generation is inhibited when the location of arrival (destination) of the vehicle 1 is known in advance and the vehicle 1 can travel to the location of arrival (destination) with the remaining capacity of the battery 36. Consequently, a useless increase in exhaust heat radiated from the radiator 64 can be suppressed. The vehicle 1 may be provided with a solar power generation device, and the battery 36 may be charged through solar power generation at least one of during travel of the vehicle 1 and after the vehicle 1 has reached the location of arrival (destination), for example. The vehicle 1 may be provided with a charging device that can externally charge the battery 36, and the battery 36 may be charged using external charging equipment installed at the location of arrival (destination) after the vehicle 1 has reached the location of arrival (destination), for example. In the vehicle 1 according to the third embodiment, the remaining capacity of the battery 36 may be secured by performing FC power generation with drive of the motor 32 stopped when the remaining capacity of the battery 36 is smaller than a predetermined capacity.

Figure 11:
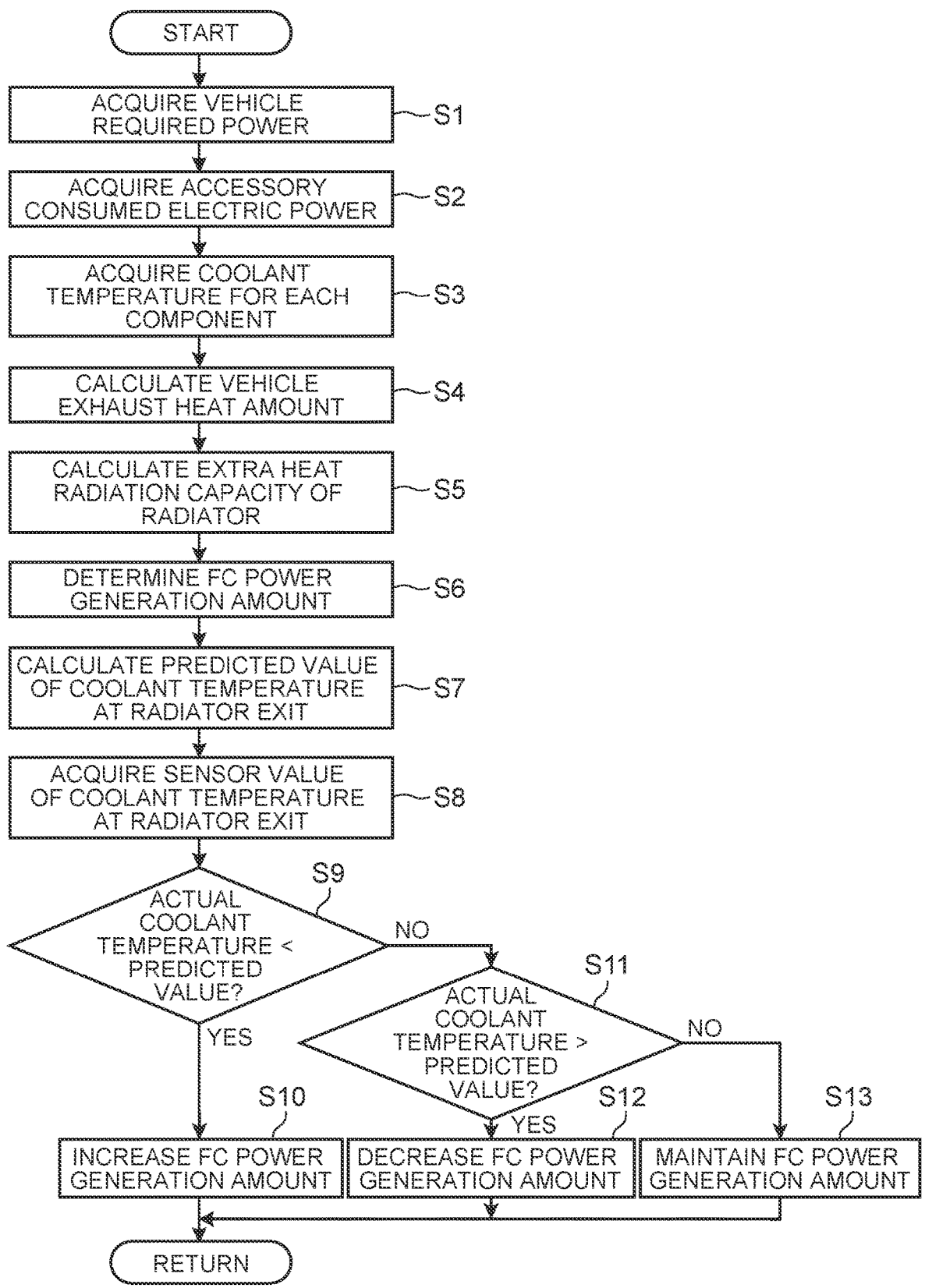
FIG. 11 is a flowchart illustrating an example of control for FC power generation performed by a main ECU.

FIG. 11 is a flowchart illustrating an example of control for FC power generation performed by the main ECU 80.

First, in step S1, the main ECU 80 acquires the present vehicle required power. Next, in step S2, the main ECU 80 acquires the present accessory consumed electric power. Next, in step S3, the main ECU 80 acquires the present coolant temperature for each component (such as the motor 32 and the battery 36) using a temperature sensor and the like provided in the cooling circuit corresponding to each component. Next, in step S4, the main ECU 80 calculates the present vehicle exhaust heat amount (power train exhaust heat+other exhaust heat) to be radiated from the radiator 64.

Next, in step S5, the main ECU 80 calculates the extra heat radiation capacity of the radiator 64 with the present vehicle required power that is obtained by subtracting the vehicle exhaust heat amount (power train exhaust heat+other exhaust heat) from the radiator heat radiation capability limit. Next, in step S6, the main ECU 80 determines the FC power generation amount for the vehicle required power using an FC power generation map such that the amount of exhaust heat generated through FC power generation falls within the range of the extra heat radiation capacity of the radiator 64. Next, in step S7, the main ECU 80 calculates a predicted value of the coolant temperature at the radiator exit as reference data for correcting the FC power generation amount. The predicted value of the coolant temperature refers to a temperature that belongs to a predetermined range. Next, in step S8, the main ECU 80 acquires an actually measured value of the coolant temperature (actual coolant temperature) at the radiator exit from the temperature sensor 62*b*.

Next, in step S9, the main ECU 80 determines whether the coolant temperature at the radiator exit meets the relationship of actual coolant temperature<predicted value. When it is determined that the coolant temperature at the radiator exit meets the relationship of actual coolant temperature<predicted value (Yes in step S9), the main ECU 80 controls FC power generation so as to increase the FC power generation amount in step S10. After that, the main ECU 80 returns the control sequence.

When it is determined that the coolant temperature at the radiator exit does not meet the relationship of actual coolant temperature<predicted value (No in step S9), on the other hand, the main ECU 80 determines whether the coolant temperature at the radiator exit meets the relationship of actual coolant temperature>predicted value in step S11. When it is determined that the coolant temperature at the radiator exit meets the relationship of actual coolant temperature>predicted value (Yes in step S11), the main ECU 80 controls FC power generation so as to decrease the FC power generation amount in step S12. After that, the main ECU 80 ends the control sequence. When it is determined that the coolant temperature at the radiator exit does not meet the relationship of actual coolant temperature>predicted value (No in step S11), on the other hand, the main ECU 80 controls FC power generation so as to maintain the FC power generation amount in step S13. After that, the main ECU 80 returns the control sequence.

In the vehicle 1 according to the third embodiment, the remaining capacity of the battery 36 can be secured in order to extend the cruising distance of the vehicle 1, by increasing the FC power generation amount when the actual coolant temperature at the radiator exit is lower than a predicted value of the coolant temperature and the radiator 64 has an extra heat radiation capacity. In the vehicle 1 according to the third embodiment, meanwhile, the heat radiation capability of the radiator 64 can be secured by reducing the amount of exhaust heat generated through FC power generation, by decreasing the FC power generation amount when the actual coolant temperature at the radiator exit is higher than a predicted value of the coolant temperature and the radiator 64 does not have an extra heat radiation capacity. Hence, with the vehicle 1 according to the third embodiment, it is possible to extend the cruising distance of the vehicle 1 by securing the remaining capacity of the battery 36 by performing FC power generation even when the amount of exhaust heat generated through FC power generation is limited such that the radiator heat radiation capability limit is not exceeded.

Control of FC power generation performed by the main ECU 80 in the vehicle 1 according to the first, second, and third embodiments is suitable not only in a high-vacuum environment, but also when there is a constraint on heat radiation from the radiator 64, for example, during travel through a tunnel or travel in an urban area.

In the first, second, and third embodiments, the vehicle 1 includes a power generation device that performs FC power generation using the fuel cell 50 and the like. However, this is not limiting, and the vehicle 1 may include an electric generator constituted from an internal combustion engine and the like as a power generation device, for example. When the vehicle 1 includes a power generation device that performs FC power generation, the battery capacity can be minimized because of a logic that suitably uses FC power generation with high weight energy density, compared to when an electric generator constituted of an internal combustion engine and the like is used. Therefore, it is possible to reduce the weight of the vehicle 1.

What is claimed is:

1. A vehicle comprising:
a power storage device;
a rotary electric machine configured to receive supply of electric power from the power storage device and generate a drive force for driving the vehicle;
a power generation device, separate from the rotary electric machine, configured to generate electric power to be supplied to the power storage device;
a heat radiation unit configured to radiate exhaust heat from the rotary electric machine and the power generation device; and
an electronic control unit configured to control power generation by the power generation device so as to increase an amount of power generated by the power generation device when vehicle required power due to drive of the vehicle is smaller than predetermined power compared to when the vehicle required power is larger than the predetermined power, an amount of power generated by the rotary electric machine and the power generation device being equal to or less than allowable generated electric power calculated from an amount of heat that is able to be radiated by the heat radiation unit,
the electronic control unit further configured to:
calculate an exhaust heat amount of the vehicle,
calculate an extra heat radiation capacity of the heat radiation unit,
determine a power generation amount of the power generation device, and
calculate the allowable generated electric power based on the exhaust heat amount of the vehicle, the extra heat radiation capacity of the heat radiation unit, and the power generation amount of the power generation device.

2. The vehicle according to claim 1, wherein the electronic control unit is configured to control power generation by the power generation device such that the amount of power generated by the power generation device is larger as the vehicle required power is smaller.

3. The vehicle according to claim 1, wherein:
the heat radiation unit is configured to also radiate exhaust heat from an accessory provided in the vehicle; and
the vehicle required power includes accessory consumed electric power consumed to drive the accessory.

4. The vehicle according to claim 1, wherein the electronic control unit is configured to control power generation by the power generation device by predicting electric power that is required for the vehicle to reach a destination.

5. The vehicle according to claim 1, wherein the electronic control unit is configured to perform power generation by the power generation device by controlling drive of the rotary electric machine when a remaining capacity of the power storage device is smaller than a predetermined capacity.

6. The vehicle according to claim 1, wherein the vehicle is configured to be able to travel in a high-vacuum environment.

7. The vehicle according to claim 1, wherein the power generation device generates power through an electrochemical reaction.

8. The vehicle according to claim 1, wherein the rotary electric machine is configured to generate electric power during braking of the vehicle.

9. A vehicle comprising:
a power storage device;
a rotary electric machine configured to receive supply of electric power from the power storage device and generate a drive force for driving the vehicle;
a power generation device, configured to generate electric power to be supplied to the power storage device;
a heat radiation unit configured to radiate exhaust heat from the rotary electric machine and the power generation device; and
an electronic control unit configured to control power generation by the power generation device so as to increase an amount of power generated by the power generation device when vehicle required power due to drive of the vehicle is smaller than predetermined power compared to when the vehicle required power is larger than the predetermined power, an amount of power generated by the rotary electric machine and the power generation device being equal to or less than allowable generated electric power calculated from an amount of heat that is able to be radiated by the heat radiation unit,
the electronic control unit is configured to control a power generation amount of the power generation device by acquiring a coolant temperature, calculating an extra heat radiation capacity of the heat radiation unit, calculate a predicted value of coolant temperature at the heat radiation unit exit, and increasing the power generation amount upon determining that the acquired coolant temperature being less than the predicted value of the coolant temperature.

10. The vehicle according to claim 9, wherein the electronic control unit is configured to control the power generation by the power generation device such that the amount of power generated by the power generation device is larger as the vehicle required power is smaller.

11. The vehicle according to claim 9, wherein:
the heat radiation unit is configured to also radiate exhaust heat from an accessory provided in the vehicle; and
the vehicle required power includes accessory consumed electric power consumed to drive the accessory.

12. The vehicle according to claim 9, wherein the electronic control unit is configured to control power generation by the power generation device by predicting electric power that is required for the vehicle to reach a destination.

13. The vehicle according to claim 9, wherein the electronic control unit is configured to perform power generation by the power generation device by controlling drive of the rotary electric machine when a remaining capacity of the power storage device is smaller than a predetermined capacity.

14. The vehicle according to claim 9, wherein the vehicle is configured to be able to travel in a high-vacuum environment.

15. The vehicle according to claim 9, wherein the power generation device generates power through an electrochemical reaction.

16. The vehicle according to claim 9, wherein the rotary electric machine is configured to generate electric power during braking of the vehicle.

* * * * *